US012622165B2

(12) United States Patent
Choi et al.

(10) Patent No.: US 12,622,165 B2
(45) Date of Patent: May 5, 2026

(54) DISPLAY DEVICE

(71) Applicant: Samsung Display Co., LTD., Yongin-si (KR)

(72) Inventors: Jonghyun Choi, Yongin-si (KR); Sungeun Lee, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 481 days.

(21) Appl. No.: 18/224,462

(22) Filed: Jul. 20, 2023

(65) Prior Publication Data

US 2024/0122054 A1 Apr. 11, 2024

(30) Foreign Application Priority Data

Oct. 6, 2022 (KR) ........................ 10-2022-0127926

(51) Int. Cl.
| | |
|---|---|
| *H10K 77/10* | (2023.01) |
| *B32B 3/26* | (2006.01) |
| *B32B 3/30* | (2006.01) |
| *B32B 7/12* | (2006.01) |
| *B32B 17/06* | (2006.01) |
| *G06F 1/16* | (2006.01) |
| *G09G 3/00* | (2006.01) |

(Continued)

(52) U.S. Cl.
CPC ............ *H10K 77/111* (2023.02); *B32B 3/266* (2013.01); *B32B 3/30* (2013.01); *B32B 7/12* (2013.01); *B32B 17/06* (2013.01); *G06F 1/1641* (2013.01); *G09G 3/3233* (2013.01); *H10K 59/1213* (2023.02); *B32B 2307/206*

(2013.01); *B32B 2457/206* (2013.01); *G09G 3/035* (2020.08); *G09G 2300/0819* (2013.01); *G09G 2300/0842* (2013.01); *G09G 2380/02* (2013.01); *H10K 2102/311* (2023.02)

(58) Field of Classification Search
CPC .... G06F 1/1641; G06F 1/1652; G06F 1/1616; H10K 2102/311; H10K 77/111; G09F 9/301; G09F 3/035; G09G 2380/02; B32B 3/266; B32B 3/30

See application file for complete search history.

(56) References Cited

U.S. PATENT DOCUMENTS

| | | | | |
|---|---|---|---|---|
| 10,642,313 B1 * | 5/2020 | Wu | ........................ | H10K 59/65 |
| 2019/0278145 A1 | 9/2019 | Tanaka et al. | | |

(Continued)

*Primary Examiner* — Jose R Diaz
(74) *Attorney, Agent, or Firm* — CANTOR COLBURN LLP

(57) ABSTRACT

A display device includes: a substrate including a first non-folding portion, a second non-folding portion, and a folding portion therebetween; a support layer disposed under the substrate and including a plurality of first portions overlapping the first and second non-folding portions, respectively, and a second portion overlapping the folding portion; a plurality of transistors disposed on the substrate, and a plurality of light emitting elements disposed above the transistors and connected to the transistors. The second portion includes a plurality of rib portions disposed between recess portions defined in a lower surface of the second portion. The folding portion includes a plurality of first folding portions overlapping the recess portions and a plurality of second folding portions overlapping the rib portions in the plan view. The transistors are not disposed in the first folding portions.

20 Claims, 10 Drawing Sheets

(51) Int. Cl.
    *G09G 3/3233*     (2016.01)
    *H10K 59/121*     (2023.01)
    *H10K 102/00*     (2023.01)

(56)             References Cited

U.S. PATENT DOCUMENTS

2020/0235084 A1*   7/2020   Wu ........................ H10D 86/60
2021/0027670 A1*   1/2021   Chou ..................... G09F 9/301
2022/0063256 A1*   3/2022   Kim ...................... B32B 27/283

* cited by examiner

DISPLAY DEVICE

This application claims priority to Korean Patent Application No. 10-2022-0127926, filed on Oct. 6, 2022, and all the benefits accruing therefrom under 35 U.S.C. § 119, the content of which in its entirety is herein incorporated by reference.

BACKGROUND

1. Field of Disclosure

The present disclosure relates to a display device.

2. Description of the Related Art

Electronic devices that provide images to a user, such as a smart phone, a digital camera, a notebook computer, a navigation unit, and a smart television, include a display device to display the images. The display device generates the images and provides the images to the user through a display screen thereof.

With the technological development for the display device, various types of display devices are being developed. For example, various display devices, which are capable of being transformed into a curved shape, foldable, or rollable, are being developed. Those display devices are easy to carry and improve a user's convenience.

A flexible display device includes a flexible display panel. The flexible display device includes non-folding portions and a folding portion. The flexible display device is vulnerable to external impacts. In particular, the folding portion is more vulnerable to the external impacts than the non-folding portions. When transistors are damaged due to the external impacts, pixels do not function normally.

SUMMARY

The present disclosure provides a display device capable of preventing transistors from being damaged even though external impacts are applied to a folding portion thereof.

Embodiments of the invention provide a display device including: a substrate including a first non-folding portion, a second non-folding portion, and a folding portion therebetween; a support layer disposed under the substrate and including a plurality of first portions overlapping the first and second non-folding portions, respectively, and a second portion overlapping the folding portion in a plan view; a plurality of transistors disposed on the substrate; and a plurality of light emitting elements disposed above the transistors and connected to the transistors. The second portion includes a plurality of rib portions disposed between recess portions defined in a lower surface of the second portion. The folding portion includes a plurality of first folding portions overlapping the recess portions and a plurality of second folding portions overlapping the rib portions in the plan view, and the transistors are not disposed in the first folding portions.

According to the above, the support layer may be attached to a lower surface of the substrate, the transistors may be disposed on the substrate, the recess portions may be defined through the folding portion of the support layer, and the folding portion may include the rib portions disposed between the recess portions. Accordingly, the flexibility of the folding portion is effectively improved, and the support layer is folded more easily.

According to the above, the transistors may not be disposed in the first folding portions of the substrate overlapping the recess portions, but the transistors may be disposed in the second folding portions of the substrate overlapping the rib portions. Thus, the transistors are disposed more stably in the folding portion.

According to the above, first openings may be defined through inorganic layers in the first and second non-folding portions, second openings may be defined through inorganic layers in the folding portion, and the second openings may be defined deeper than the first openings. As the second openings may be defined between the first and second folding portions, the transistors may be disposed between the second openings. Therefore, when cracks occur in the inorganic layers in one folding portion due to external impacts, the cracks are not propagated to the transistors in the next folding portion and the transistors in the next folding portion are prevented from being damaged. Accordingly, the folding portion is effectively prevented from being damaged even though the external impacts are applied.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
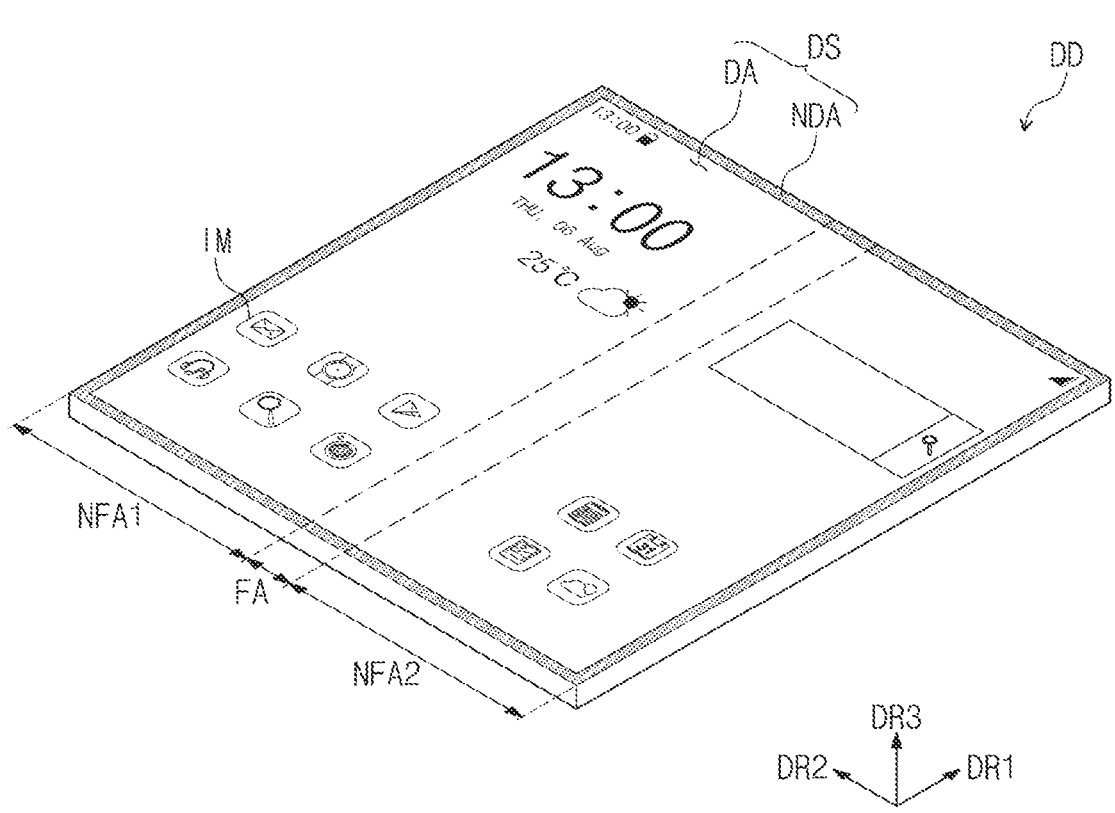
FIG. 1 is a perspective view of a display device according to an embodiment of the present disclosure.

Features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this disclosure will be through and complete and will fully convey the invention to those skilled in the art, and the invention will only be defined by the appended claims. Like reference numerals denote like elements throughout the specification.

In the present disclosure, it will be understood that when an element or layer is referred to as being "on", "connected to" or "coupled to" another element or layer, it can be directly on, connected or coupled to the other element or layer or intervening elements or layers may be present. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Embodiments described in the disclosure are described with reference to plan views and cross-sectional views that are ideal schematic diagrams. Accordingly, shapes of the views may vary depending on manufacturing technologies and/or tolerances. Thus, embodiments are not limited to shown specific forms and also include variations in form produced according to manufacturing processes. Therefore, regions illustrated in the drawings are examples, and the shapes of the regions illustrated in the drawings are intended to illustrate the specific shapes of the regions of elements and not to limit the scope of the present disclosure.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Hereinafter, embodiments of the present disclosure will be described with reference to accompanying drawings.

FIG. 1 is a perspective view of a display device DD according to an embodiment of the present disclosure.

Referring to FIG. 1, the display device DD may have a rectangular shape defined by long sides extending in a first direction DR1 and short sides extending in a second direction DR2 crossing the first direction DR1. However, the shape of the display device DD should not be limited to the rectangular shape, and the display device DD may have various shapes, such as a circular shape and a polygonal shape. The display device DD may be a flexible display device.

The display device DD may include a folding area FA and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The first non-folding area NFA1, the folding area FA, and the second non-folding area NFA2 may be arranged in the second direction DR2.

In the present embodiment, one folding area FA and two non-folding areas NFA1 and NFA2 are shown as a representative example, however, the number of the folding areas FA and the number of non-folding areas NFA1 and NFA2 should not be limited thereto or thereby. As an example, the display device DD may include more than two non-folding areas and a plurality of folding areas disposed between the non-folding areas.

An upper surface of the display device DD may be referred to as a display surface DS, and the display surface DS may be a plane defined by the first direction DR1 and the second direction DR2. Images IM generated by the display device DD may be provided to a user through the display surface DS.

The display surface DS may include a display area DA and a non-display area NDA around the display area DA. The display area DA may display the image, and the non-display area NDA may not display the image. The non-display area NDA may surround the display area DA and may define an edge of the display device DD, which is printed by a predetermined color.

Figure 2:
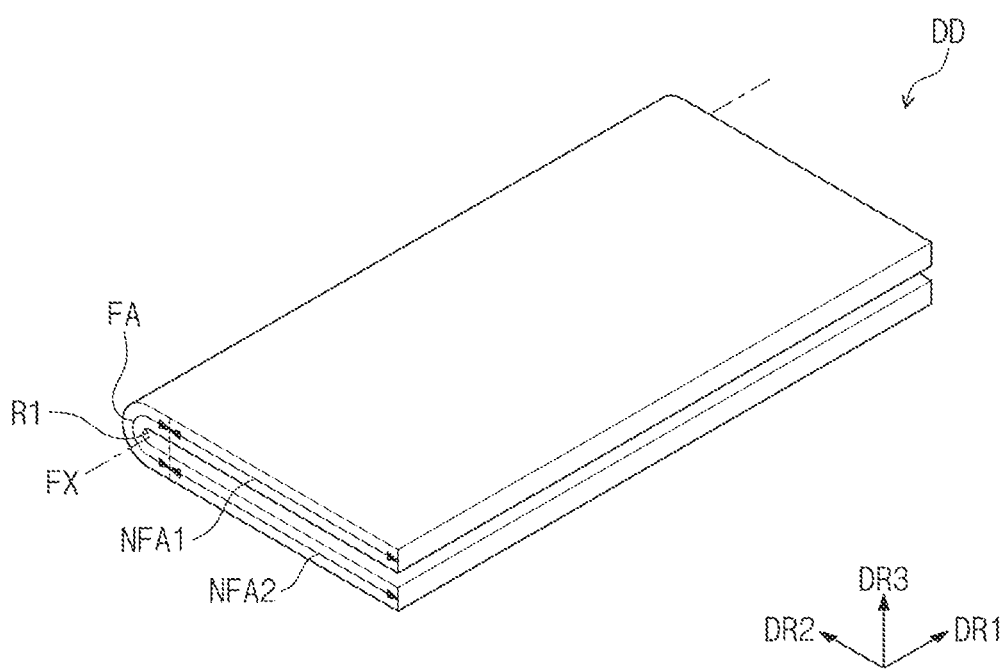
FIG. 2 is a perspective view of a folded state of the display device shown in FIG. 1.

FIG. 2 is a perspective view of a folded state of the display device DD shown in FIG. 1.

Referring to FIG. 2, the display device DD may be a foldable display device DD that is folded or unfolded. For example, the folding area FA may be folded with respect to a folding axis FX substantially parallel to the first direction DR1, and thus, the display device DD may be folded. The folding axis FX may be defined as a major axis substantially parallel to the long sides of the display device DD.

When the display device DD is folded, the display device DD may be inwardly folded (in-folding) such that the first non-folding area NFA1 and the second non-folding area NFA2 may face each other and the display surface DS may not be exposed to the outside. However, the present disclosure should not be limited thereto or thereby. As an example, the display device DD may be outwardly folded (out-folding) with respect to the folding axis FX such that the display surface DS may be exposed to the outside.

As shown in FIG. 2, a distance between the first non-folding area NFA1 and the second non-folding area NFA2 may be substantially the same as twice a radius of curvature R1.

Figure 3:
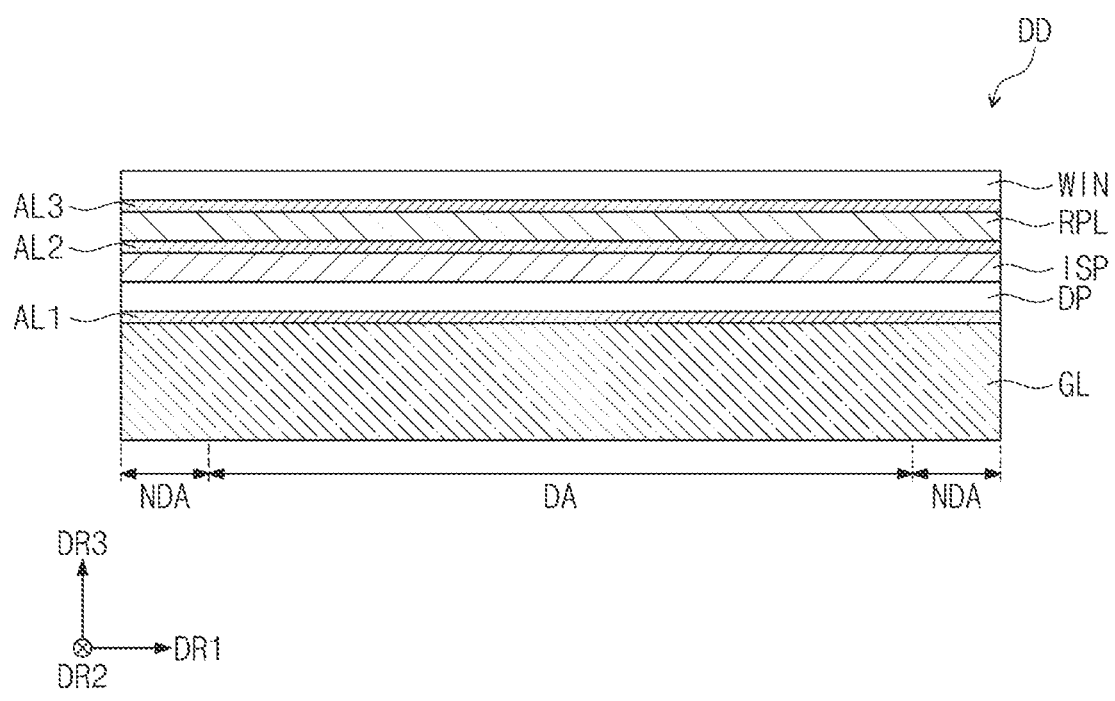
FIG. 3 is a cross-sectional view of the display device shown in FIG. 1.

FIG. 3 is a cross-sectional view of the display device DD shown in FIG. 1.

FIG. 3 shows a cross-section of the display device DD when viewed in the second direction DR2 as a representative example.

The display device DD may include a display panel DP, an input sensing unit ISP, an anti-reflective layer RPL, a window WIN, a support layer GL, and first, second, and third adhesive layers AL1, AL2, and AL3.

The display panel DP may be a flexible display panel. The display panel DP may be a light-emitting type display panel, however, it should not be particularly limited. For instance, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot or a quantum rod.

The input sensing unit ISP may be disposed on the display panel DP. The input sensing unit ISP may include a plurality of sensing portions (not shown) to sense an external input by a capacitive method. The input sensing unit ISP may be manufactured directly on the display panel DP when the display device DD is manufactured, however, it should not be limited thereto or thereby. According to an embodiment, the input sensing unit ISP may be attached to the display panel DP by an adhesive layer after being manufactured separately from the display panel DP.

The anti-reflective layer RPL may be disposed on the input sensing unit ISP. The anti-reflective layer RPL may be defined as an external light reflection preventing film. The anti-reflective layer RPL may reduce a reflectance of an external light incident to the display panel DP from the above of the display device DD.

In a case where the external light incident to the display panel DP is provided to the user after being reflected by the display panel DP, like a mirror, the user may perceive the external light. The anti-reflective layer RPL may include a plurality of color filters (not shown) that displays the same colors as pixels to prevent the above-mentioned phenomenon.

The color filters may filter the external light to allow the external light to have the same color as the pixels. In this case, the external light may not be perceived by the user, however, the present disclosure should not be limited thereto or thereby. According to an embodiment, the anti-reflective layer RPL may include a retarder and/or a polarizer to reduce the reflectance of the external light.

The window WIN may be disposed on the anti-reflective layer RPL. The window WIN may protect the display panel DP, the input sensing unit ISP, and the anti-reflective layer RPL from external scratches and impacts.

The support layer GL may be disposed under the display panel DP. The support layer GL may protect a rear surface of the display panel DP. The support layer GL may include a glass material. The support layer GL may be folded together with the display panel DP. The support layer GL will be described in detail with reference to FIG. 6.

The first adhesive layer AL1 may be disposed between the display panel DP and the support layer GL. The display panel DP and the support layer GL may be coupled to each other by the first adhesive layer AL1. The second adhesive layer AL2 may be disposed between the anti-reflective layer RPL and the input sensing unit ISP. The anti-reflective layer RPL and the input sensing unit ISP may be coupled to each other by the second adhesive layer AL2. The third adhesive layer AL3 may be disposed between the window WIN and the anti-reflective layer RPL. The window WIN and the anti-reflective layer RPL may be coupled to each other by the third adhesive layer AL3.

Figure 4:
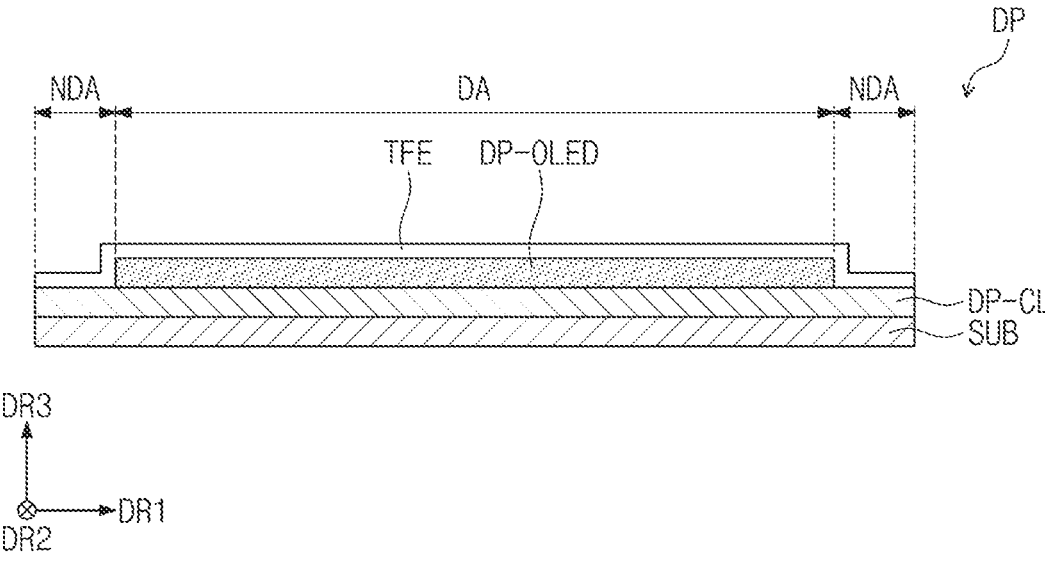
FIG. 4 is a cross-sectional view of a display panel shown in FIG. 3.

Although not shown in figures, the display device DD may further include a panel protective film disposed under the support layer GL. The panel protective film may include a flexible plastic material such as polyethyleneterephthalate ("PET"). FIG. 4 is a cross-sectional view of the display panel DP shown in FIG. 3.

FIG. 4 shows a cross-section of the display panel DP when viewed in the second direction DR2 as a representative example.

Referring to FIG. 4, the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include the display area DA and the non-display area NDA around the display area DA. The substrate SUB may include a flexible plastic material such as polyimide ("PI"). The display element layer DP-OLED may be disposed in the display area DA.

A plurality of pixels PX described with reference to FIG. 5 may be disposed in the display area DA. Each pixel may include a transistor disposed on the circuit element layer DP-CL and a light emitting element disposed on the display element layer DP-OLED and connected to the transistor. The connection relationship between the transistor and the light emitting element will be described in detail with reference to FIG. 9.

The thin film encapsulation layer TFE may be disposed on the circuit element layer DP-CL to cover the display element layer DP-OLED. The thin film encapsulation layer TFE may include inorganic layers and an organic layer disposed between the inorganic layers. The inorganic layers may protect the pixels PX from moisture and oxygen, and the organic layer may protect the pixels PX from a foreign substance such as dust particles.

Figure 5:
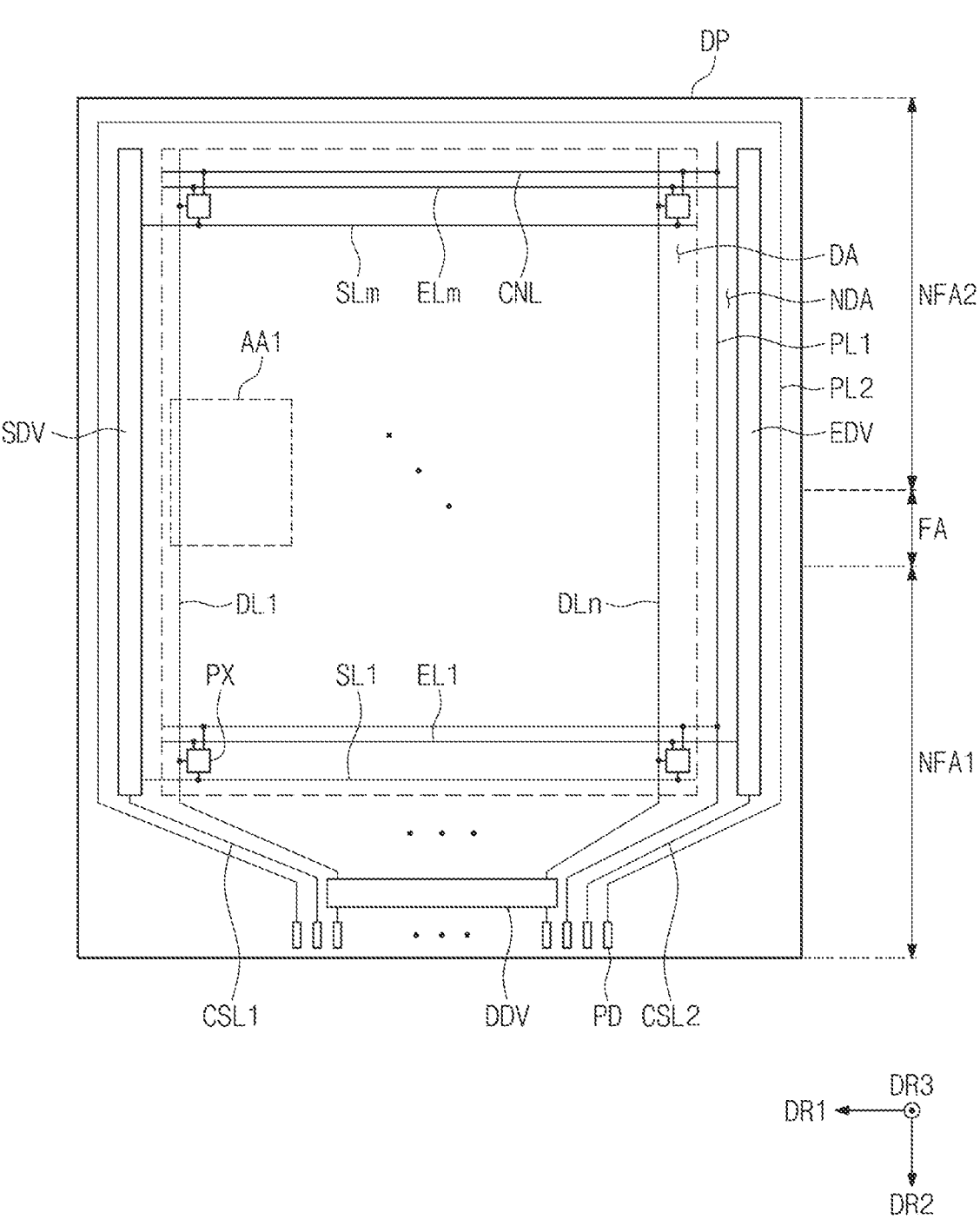
FIG. 5 is a plan view of the display panel shown in FIG. 4.

FIG. 5 is a plan view of the display panel DP shown in FIG. 4, and a bottom view. As used herein, the "plan view" is a view in the third direction DR3 in an unfolded state of the display device.

Referring to FIG. 5, the display device DD may include the display panel DP, a scan driver SDV, a data driver DDV, an emission driver EDV, and a plurality of pads PD.

The display panel DP may have a rectangular shape having long sides extending in the first direction DR1 and short sides extending in the second direction DR2, however, the shape of the display panel DP should not be limited thereto or thereby. The display panel DP may include the display area DA and the non-display area NDA surrounding the display area DA.

The display panel DP may include the pixels PX, a plurality of scan lines SL1 to SLm, a plurality of data lines DL1 to DLn, a plurality of emission lines EL1 to E1$m$, first and second control lines CSL1 and CSL2, first and second power lines PL1 and PL2, and connection lines CNL. Each of "m" and "n" is a natural number.

The pixels PX may be arranged in the display area DA. The scan driver SDV and the emission driver EDV may be disposed in the non-display area NDA adjacent to the long sides of the display panel DP, respectively. The data driver DDV may be disposed in the non-display area NDA to be adjacent to one short side of the short sides of the display panel DP. When viewed in a plane (i.e., in a plan view), the data driver DDV may be disposed to be adjacent to a lower end of the display panel DP.

The scan lines SL1 to SLm may extend in the first direction DR1 and may be connected to the pixels PX and the scan driver SDV. The data lines DL1 to DLn may extend in the second direction DR2 and may be connected to the pixels PX and the data driver DDV. The emission lines EL1 to ELm may extend in the first direction DR1 and may be connected to the pixels PX and the emission driver EDV.

The first power line PL1 may extend in the second direction DR2 and may be disposed in the non-display area NDA. The first power line PL1 may be disposed between the display area DA and the emission driver EDV.

The connection lines CNL may extend in the first direction DR1 and may be arranged in the second direction DR2. The connection lines CNL may be connected to the first power line PL1 and the pixels PX. A first voltage may be applied to the pixels PX through the first power line PL1 and the connection lines CNL connected to the first power line PL1. The connection lines CNL may be defined as portions of the first power line PL1 receiving the first voltage.

The second power line PL2 may be disposed in the non-display area NDA. The second power line PL2 may extend along the long sides of the display panel DP and the other short side at which the data driver DDV is not disposed in the display panel DP. The second power line PL2 may be disposed outside the scan driver SDV and the emission driver EDV.

Although not shown in figures, the second power line PL2 may extend to the display area DA and may be connected to the pixels PX. A second voltage having a level lower than a voltage level of the first voltage may be applied to the pixels PX through the second power line PL2.

The first control line CSL1 may be connected to the scan driver SDV and may extend toward the lower end of the display panel DP when viewed in a plane (i.e., in a plan view). The second control line CSL2 may be connected to the emission driver EDV and may extend toward the lower end of the display panel DP when viewed in a plane. The data driver DDV may be disposed between the first control line CSL1 and the second control line CSL2.

The pads PD may be disposed in the non-display area NDA adjacent to the lower end of the display panel DP. The pads PD may be disposed closer to the lower end of the display panel DP than the data driver DDV is. The data driver DDV, the first power line PL1, the second power line PL2, the first control line CSL1, and the second control line CSL2 may be connected to the pads PD. The data lines DL1 to DLn may be connected to the data driver DDV, and the data driver DDV may be connected to the pads PD corresponding to the data lines DL1 to DLn.

Although not shown in figures, the display device DD may further include a timing controller to control an operation of the scan driver SDV, the data driver DDV, and the emission driver EDV and a voltage generator to generate the first and second voltages. The timing controller and the voltage generator may be connected to corresponding pads PD through a printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

The pixels PX may receive the data voltages in response to the scan signals. The pixels PX may emit a light having a luminance corresponding to the data voltages in response to the emission signals, and thus, the image may be displayed.

Figure 6:
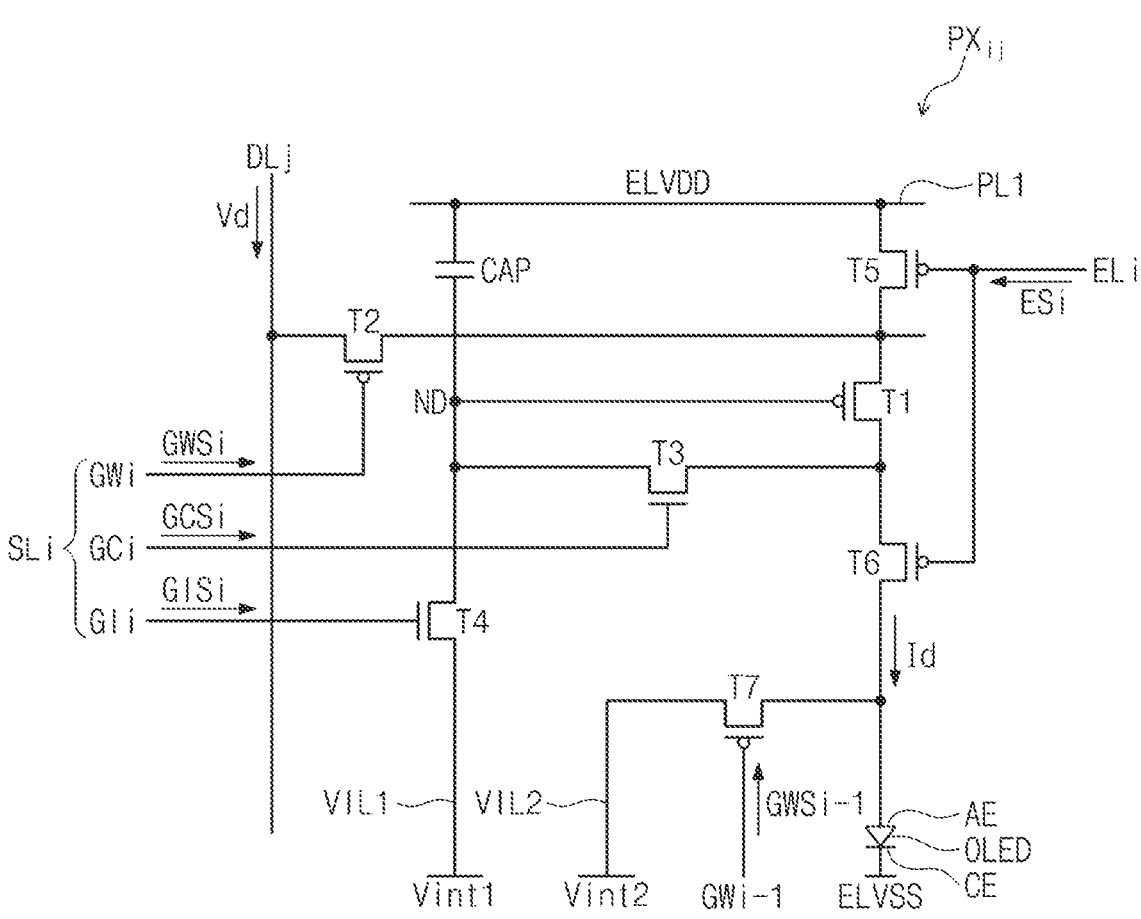
FIG. 6 is an equivalent circuit diagram of one pixel shown in FIG. 5.

FIG. 6 is an equivalent circuit diagram of one pixel PXij shown in FIG. 5.

FIG. 6 shows the pixel PXij connected to an i-th scan line SLi, an i-th emission line ELi, and a j-th data line DLj as a representative example. In the present embodiment, each of "i" and "j" denotes a natural number.

Referring to FIG. 6, the pixel PXij may include a light emitting element OLED, a plurality of transistors T1 to T7, and a capacitor CAP. The transistors T1 to T7 and the capacitor CAP may control a current amount of a current flowing through the light emitting element OLED. The light emitting element OLED may generate a light with a predetermined luminance according to the current amount of the current supplied thereto.

The i-th scan line SLi may include an i-th write scan line GWi, an i-th compensation scan line GCi, and an i-th initialization scan line GIi. The i-th write scan line GWi may receive an i-th write scan signal GWSi, the i-th compensation scan line GCi may receive an i-th compensation scan signal GCSi, and the i-th initialization scan line GIi may receive an i-th initialization scan signal GISi.

Each of the transistors T1 to T7 may include a source electrode, a drain electrode, and a gate electrode. In the following descriptions, for the convenience of explanation, one electrode of the source electrode and the drain electrode may be referred to as a first electrode, and the other electrode of the source electrode and the drain electrode may be referred to as a second electrode. In addition, the gate electrode may be referred to as a control electrode.

The transistors T1 to T7 may include first, second, third, fourth, fifth, sixth, and seventh transistors T1, T2, T3, T4, T5, T6, and T7. Each of the first, second, fifth, sixth, and seventh transistors T1, T2, T5, T6, and T7 may be a PMOS transistor, and each of the third and fourth transistors T3 and T4 may be an NMOS transistor.

The first transistor T1 may be defined as a driving transistor, and the second transistor T2 may be defined as a switching transistor. The third transistor T3 may be defined as a compensation transistor.

The fourth transistor T4 and the seventh transistor T7 may be defined as initialization transistors. The fifth transistor T5 and the sixth transistor T6 may be defined as emission control transistors.

The light emitting element OLED may be defined as an organic light emitting element. The light emitting element OLED may include an anode AE and a cathode CE. The anode AE may receive the first voltage ELVDD via the sixth, first, and fifth transistors T6, T1, and T5. The cathode CE may receive the second voltage ELVSS.

The first transistor T1 may be connected between the anode AE of the light emitting element OLED and the first power line PL1 receiving the first voltage ELVDD and may be switched on or off in response to a voltage of a node ND. In detail, the first transistor T1 may be connected between the fifth transistor T5 and the sixth transistor T6. The first transistor T1 may receive the first voltage ELVDD via the fifth transistor T5 and may be connected to the anode AE via the sixth transistor T6.

The first transistor T1 may include a first electrode receiving the first voltage ELVDD via the fifth transistor T5, a second electrode connected to the anode AE via the sixth transistor T6, and a control electrode connected to the node ND.

The first electrode of the first transistor T1 may be connected to the fifth transistor T5, the second electrode of the first transistor T1 may be connected to the sixth transistor T6, and the control electrode of the first transistor T1 may be connected to the node ND. The first transistor T1 may control the current amount of the current flowing through the light emitting element OLED in response to the voltage of the node ND, which is applied to the control electrode of the first transistor T1.

The second transistor T2 may be connected between the first transistor T1 connected to the first power line PL1 and the data line DLj and may be switched on or off in response to the write scan signal GWSi. In detail, the second transistor T2 may be connected to the first power line PL1 via the fifth transistor T5. The second transistor T2 may be connected between the data line DLj and the first electrode of the first transistor T1.

The second transistor T2 may include a first electrode connected to the data line DLj, a second electrode connected to the first electrode of the first transistor T1, and a control electrode connected to the i-th write scan line GWi.

The second transistor T2 may be turned on in response to the i-th write scan signal GWSi applied thereto via the i-th write scan line GWi and may electrically connect the data line DLj to the first electrode of the first transistor T1. The second transistor T2 may perform a switching operation to apply a data voltage Vd applied thereto via the data line DLj to the first electrode of the first transistor T1.

The third transistor T3 may be connected between the node ND and the anode AE of the light emitting element OLED and may be switched on or off in response to the compensation scan signal GCSi. In detail, the third transistor T3 may be connected to the anode AE via the sixth transistor T6. The third transistor T3 may be connected between the second electrode of the first transistor T1 and the node ND.

The third transistor T3 may include a first electrode connected to the second electrode of the first transistor T1, a second electrode connected to the node ND, and a control electrode connected to the i-th compensation scan line GCi.

The third transistor T3 may be turned on in response to the i-th compensation scan signal GCSi applied thereto via the i-th compensation scan line GCi and may electrically connect the second electrode of the first transistor T1 to the control electrode of the first transistor T1. When the third transistor T3 is turned on, the first transistor T1 and the third transistor T3 may be connected in a diode configuration.

The fourth transistor T4 may be connected between the node ND and a first initialization line VIL1 and may be switched on or off in response to the i-th initialization scan signal GISi. The fourth transistor T4 may include a first electrode connected to the node ND, a second electrode connected to the first initialization line VIL1, and a control electrode connected to the i-th initialization scan line GIi.

The fourth transistor T4 may be turned on in response to the i-th initialization scan signal GISi applied thereto via the i-th initialization scan line GIi and may apply a first initialization voltage Vint1 applied thereto via the first initialization line VIL1 to the node ND.

The fifth transistor T5 may be connected between the first power line PL1 and the first transistor T1. The fifth transistor T5 may include a first electrode receiving the first voltage ELVDD, a second electrode connected to the first electrode of the first transistor T1, and a control electrode connected to the i-th emission line ELi.

The sixth transistor T6 may be connected between the first transistor T1 and the anode AE. The sixth transistor T6 may include a first electrode connected to the second electrode of the first transistor T1, a second electrode connected to the anode AE, and a control electrode connected to the i-th emission line ELi.

The fifth transistor T5 and the sixth transistor T6 may be turned on in response to an i-th emission signal ESi applied thereto via the i-th emission line ELi. The first voltage ELVDD may be provided to the light emitting element OLED via the turned-on fifth transistor T5 and the sixth transistor T6, and a driving current may flow through the light emitting element OLED. Accordingly, the light emitting element OLED may emit a light.

The seventh transistor T7 may include a first electrode connected to the anode AE, a second electrode connected to a second initialization line VIL2, and a control electrode connected to an (i−1)th write scan line GWi−1. The (i−1)th write scan line GWi−1 may correspond to a write scan line of a previous stage of the i-th write scan line GWi.

The seventh transistor T7 may be turned on in response to an (i−1)th write scan signal GWSi−1 applied thereto via the (i−1)th write scan line GWi−1 and may provide a second initialization voltage Vint2 applied thereto via the second initialization line VIL2 to the anode AE of the light emitting element OLED.

The seventh transistor T7 may improve the ability to display deep black color of the pixel PX. In detail, when the seventh transistor T7 is turned on, a parasitic capacitance (not shown) of the light emitting element OLED may be discharged. Accordingly, when implementing a black luminance, the light emitting element OLED does not emit the light even though a leakage current occurs from the first transistor T1, and thus the ability to display deep black color may be improved.

The capacitor CAP may include a first electrode receiving the first voltage ELVDD and a second electrode connected to the node ND. When the fifth transistor T5 and the sixth transistor T6 are turned on, a current amount of a current flowing through the first transistor T1 may be determined by a voltage charged in the capacitor CAP.

Figure 7:
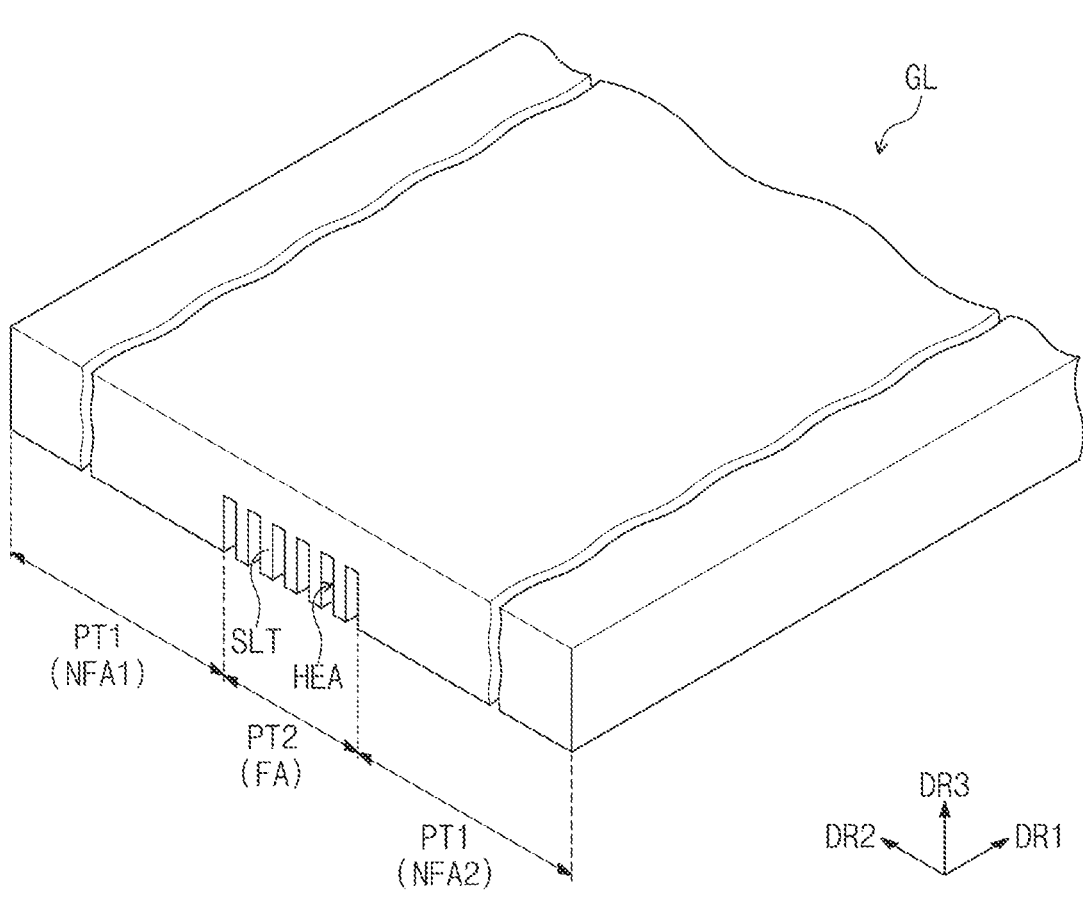
FIG. 7 is a perspective view of a support layer shown in FIG. 3.

FIG. 7 is a perspective view of the support layer GL shown in FIG. 3.

Referring to FIGS. 1 and 7, the support layer GL may have a rectangular shape having long sides extending in the first direction DR1 and short sides extending in the second direction DR2, however, the shape of the support layer GL should not be limited thereto or thereby. The support layer GL may have a circular shape or a polygonal shape.

The support layer GL may include a plurality of first portions PT1 and a second portion PT2. The second portion PT2 may be disposed between the first portions PT1. The first portions PT1 and the second portion PT2 may be arranged in the second direction DR2.

When viewed in the plane (i.e., in a plan view), the first portions PT1 may overlap the first non-folding area NFA1 and the second non-folding area NFA2, respectively. As an example, the first portion PT1 disposed at a left side may overlap the first non-folding area NFA1, and the first portion PT1 disposed at a right side may overlap the second non-folding area NFA2. When viewed in the plane, the second portion PT2 may overlap the folding area FA.

The second portion PT2 may include a plurality of rib portions SLT. The rib portions SLT may be disposed at a lower surface of the second portion PT2. An upper surface of the second portion PT2 may face the display panel DP. The lower surface of the second portion PT2 may be opposite to the upper surface of the second portion PT2. The rib portions SLT may extend in the first direction DR1 and may be spaced apart from each other in the second direction DR2.

Recess portions HEA may be defined in the lower surface of the second portion PT2. Each of the recess portions HEA may be defined between two rib portions SLT adjacent to each other.

The recess portions HEA may extend from the lower surface of the second portion PT2 toward the upper surface of the second portion PT2. As an example, a depth in a third direction DR3 of the recess portions HEA may correspond to a half of a thickness of the support layer GL. That is, the recess portions HEA may extend from the same height as the lower surface of the rib portions SLT to a point corresponding to the half of the thickness of the rib portions SLT. However, the depth in the third direction DR3 of the recess portions HEA should not be limited thereto or thereby, and the recess portions HEA may extend to the same height as the upper surface of the rib portions SLT in another embodiment. In this case, the rib portions SLT may be separated (i.e., not connected) from each other in the second direction DR2. As used herein, the "thickness" is measured in the third direction DR3 when the display device is in an unfolded state.

As the recess portions HEA are defined in the second portion PT2, the area of the second portion PT2 in a cross-sectional view may be reduced, and the rigidity of the support layer GL may be reduced. Accordingly, the flexibility of the support layer GL may be higher when the recess portions HEA are defined than when the recess portions HEA are not defined in the support layer GL. As a result, the support layer GL may be folded more easily.

Figure 8:
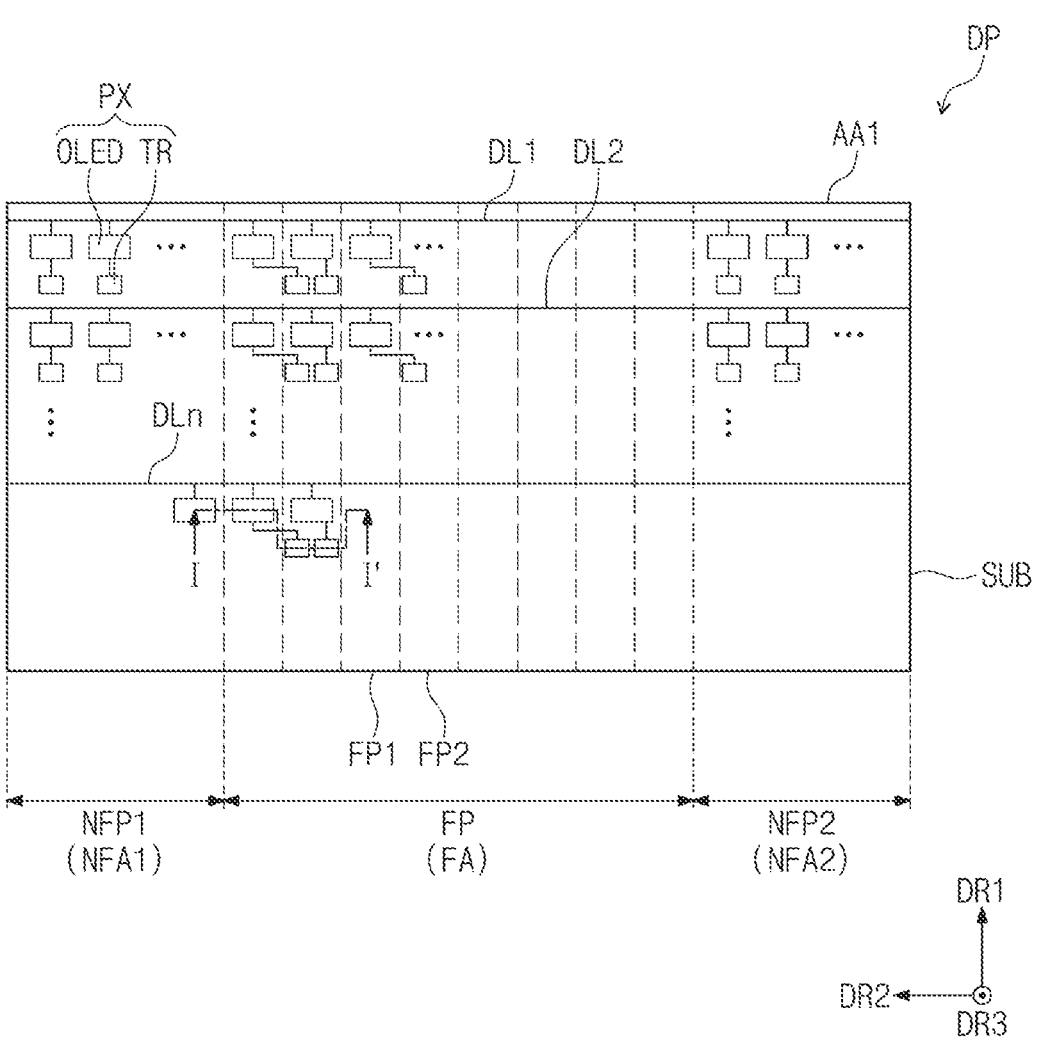
FIG. 8 is an enlarged view of an area AA1 shown in FIG. 5.

FIG. 8 is an enlarged view of an area AA1 shown in FIG. 5.

For convenience of description, the first to seventh transistors T1 to T7 shown in FIG. 6 are schematically illustrated as one transistor TR in FIG. 8. Hereinafter, each of the transistors TR will be defined as including first to seventh transistors. In addition, the transistors TR disposed on the substrate SUB will be described.

Referring to FIGS. 1, 7, and 8, the substrate SUB may include a folding portion FP and first and second non-folding portions NFP1 and NFP2. The folding portion FP may be disposed between the first and second non-folding portions NFP1 and NFP2. The first non-folding portion NFP1, the folding portion FP, and the second non-folding portion NFP2 may be sequentially arranged in the second direction DR2. When viewed in the plane (i.e., in a plan view), the folding portion FP may overlap the folding area FA, and the first and second non-folding portions NFP1 and NFP2 may overlap the first and second folding areas NFA1 and NFA2, respectively.

The folding portion FP of the substrate SUB may include a plurality of first folding portions FP1 and a plurality of second folding portions FP2. When viewed in the plane, the first folding portions FP1 may overlap the recess portions HEA shown in FIG. 7. When viewed in the plane (i.e., in a plan view), the second folding portions FP2 may overlap the rib portions SLT shown in FIG. 7.

The data lines DL1 to DLn and the pixels PX may be disposed on the substrate SUB. Each of the pixels PX may include the light emitting element OLED and the transistor TR connected to the light emitting element OLED. For the convenience of explanation, FIG. 8 shows a structure in which one transistor TR is connected to one light emitting element OLED. However, substantially the first to seventh transistors T1 to T7 shown in FIG. 6 may be connected to a corresponding light emitting element OLED among the light emitting elements OLED. The data lines DL1 to DLn may extend from the first non-folding portion NFP1 to the second direction DR2 and may extend to the second non-folding portion NFP2 after passing through the folding portion FP.

The light emitting elements OLED and the transistors TR may be disposed on the first non-folding portion NFP1, the second non-folding portion NFP2, and the folding portion FP. The light emitting elements OLED may be disposed on the first folding portions FP1 and the second folding portions FP2. The transistors TR may be disposed on the second folding portions FP2 and may not be disposed on the first folding portions FP1.

Since the transistors TR are not disposed on the first folding portions FP1, the transistors TR may not overlap the recess portion HEA when viewed in the plane (i.e., in a plan view). The transistors TR may overlap the rib portions SLT when viewed in the plane. The light emitting elements OLED may not overlap the transistors TR in the first folding portions FP1.

Each of the light emitting elements OLED disposed on the first folding portions FP1 may be connected to some transistors TR among the transistors TR disposed on the second folding portions FP2 adjacent thereto. Each of the light emitting elements OLED disposed on the second folding portions FP2 may be connected to the other transistors TR among the transistors TR disposed on the second folding portions FP2. The connection relationship between the transistors TR and the light emitting elements OLED, which are disposed on the folding portion FP, will be described in detail with reference to FIG. 10.

Figure 9:
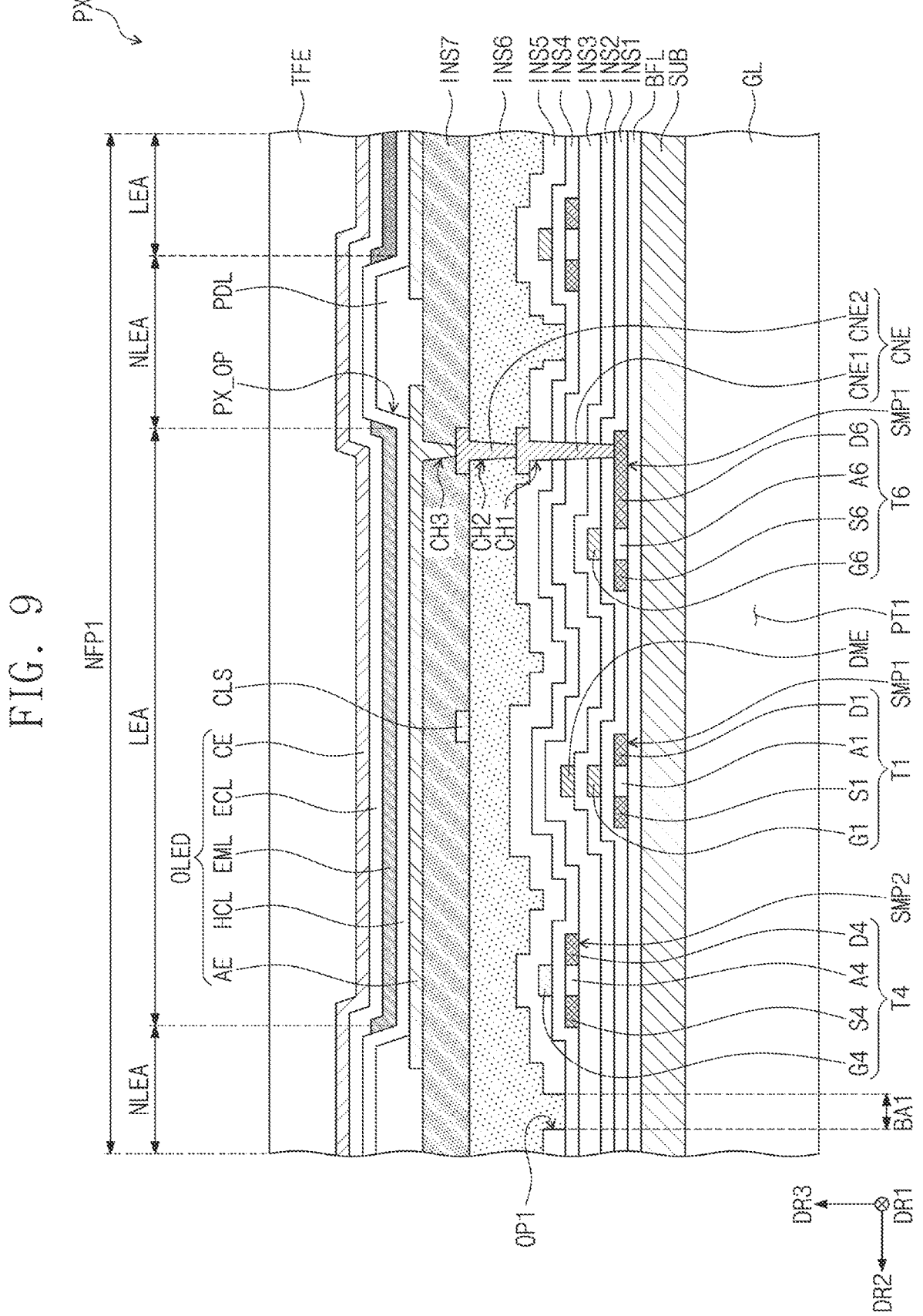
FIG. 9 is a cross-sectional view of a light emitting element and transistors shown in FIG. 6.

FIG. 9 is a cross-sectional view of one pixel disposed in the first non-folding portion NFP1 in FIG. 5.

FIG. 9 shows the first transistor T1, the fourth transistor T4, and the sixth transistor T6 shown in FIG. 6 as a representative example.

In FIG. 9, the second non-folding portion NFP2 may be substantially the same as the first non-folding portion NFP1. Hereinafter, descriptions are made based on components of the pixel PX disposed in the first non-folding portion NFP1, and the structure of the pixel PX disposed in the second non-folding portion NFP2 may be substantially the same as the structure of the pixel PX of FIG. 9.

Referring to FIG. 9, the pixel PX may include the light emitting elements OLED and the transistors T1, T4, and T6. Although not shown figures, the pixel PX may include second, third, fifth, and seventh transistors T2, T3, T5, and T7 and at least one capacitor CAP.

A buffer layer BFL may be disposed on the substrate SUB. The buffer layer BFL may be an inorganic layer. A first semiconductor pattern SMP1 of each of the first and sixth transistors T1 and T6 may be disposed on the buffer layer BFL. Each of the first and sixth transistors T1 and T6 may be a silicon transistor. The first semiconductor pattern SMP1 may include polysilicon, however, the present disclosure should not be limited thereto or thereby. According to an embodiment, the first semiconductor pattern SMP1 may include amorphous silicon.

The first semiconductor pattern SMP1 may be doped with an N-type dopant or a P-type dopant. The first semiconductor pattern SMP1 may include a high-doped region and a low-doped region. The high-doped region may have a conductivity greater than a conductivity of the low-doped region and may substantially serve as a source electrode and a drain electrode of the transistor TR. The low-doped region may substantially correspond to an active (or a channel) of the transistor TR.

A source electrode S1, an active A1, and a drain electrode D1 of the first transistor T1 and a source electrode S6, an active A6, and a drain electrode D6 of the sixth transistor T6 may be formed from the first semiconductor pattern SMP1. The active A1 may be disposed between the source electrode S1 and the drain electrode D1. The active A6 may be disposed between the source electrode S6 and the drain electrode D6.

A first insulating layer INS1 may be disposed on the buffer layer BFL to cover the first semiconductor pattern SMP1. Gate electrodes G1 and G6 (or control electrodes) of the first and sixth transistors T1 and T6 may be disposed on the first insulating layer INS1.

Although not shown in figures, a source electrode, an active, a drain electrode, and a gate electrode of each of the second, fifth, and seventh transistors T2, T5, and T7 may have substantially the same structure as those of the first and sixth transistors T1 and T6.

A second insulating layer INS2 may be disposed on the first insulating layer INS1 to cover the gate electrodes G1 and G6. A dummy electrode DME may be disposed on the second insulating layer INS2. The dummy electrode DME may be placed at a position higher than the first and sixth transistors T1 and T6. The dummy electrode DME may form the above-mentioned capacitor CAP together with the gate electrode G1. A third insulating layer INS3 may be disposed on the second insulating layer INS2 to cover the dummy electrode DME.

A second semiconductor pattern SMP2 of the fourth transistor T4 may be disposed on the third insulating layer INS3. The fourth transistor T4 may be placed at a position higher than the first and sixth transistors T1 and T6. The fourth transistor T4 may be an oxide transistor. The second semiconductor pattern SMP2 may include an oxide semiconductor containing metal oxide. The oxide semiconductor may include a crystalline or amorphous oxide semiconductor.

The second semiconductor pattern SMP2 may include a plurality of areas having different electrical properties depending on whether the metal oxide is reduced. An area (hereinafter, referred to as a reduced area) where the metal oxide is reduced may have a conductivity higher than a conductivity of an area (hereinafter, referred to as a non-reduced area) where the metal oxide is not reduced. The reduced area may substantially act as the source electrode or the drain electrode of the transistor. The non-reduced area may substantially correspond to the active (or channel) of the transistor.

A source electrode S4, an active A4, and a drain electrode D4 of the fourth transistor T4 may be formed from the second semiconductor pattern SMP2. The active A4 may be disposed between the source electrode S4 and the drain electrode D4.

A fourth insulating layer INS4 may be disposed on the third insulating layer INS3 to cover the second semiconductor pattern SMP2. A gate electrode G4 (or a control electrode) of the fourth transistor T4 may be disposed on the fourth insulating layer INS4. A fifth insulating layer INS5 may be disposed on the fourth insulating layer INS4 to cover the gate electrode G4. Although not shown in figures, a source electrode, an active, a drain electrode, and a gate electrode of the third transistor T3 may have substantially the same structure as those of the fourth transistor T4.

The buffer layer BFL and the first to fifth insulating layers INS1 to INS5 may include inorganic layers. As an example, the buffer layer BFL and the first insulating layer INS1 may include a silicon oxide layer, and the second insulating layer INS2 may include a silicon nitride layer. The third insulating layer INS3 may include a plurality of inorganic insulating layers containing different materials from each other and stacked one on another. As an example, the third insulating layer INS3 may include a silicon nitride layer and a silicon oxide layer, which are stacked on each other.

The fourth insulating layer INS4 may include a silicon oxide layer. The fifth insulating layer INS5 may include a plurality of inorganic insulating layers containing different materials from each other and stacked one on another. As an example, the fifth insulating layer INS5 may include a silicon oxide layer and a silicon nitride layer, which are stacked on each other. Each of the third and fifth insulating layers INS3 and INS5 may have a thickness greater than a thickness of each of the buffer layer BFL and the first, second, and fourth insulating layers INS1, INS2, and INS4. Hereinafter, the first to fifth insulating layers INS1 to INS5 may be referred to as the inorganic insulating layers.

A first connection electrode CNE1 may be disposed on the fifth insulating layer INS5. The first connection electrode CNE1 may be connected to the drain electrode D6 via a first contact hole CH1 defined through the first to fifth insulating layer INS1 to INS5.

The substrate SUB may include a first boundary portion BA1. The first boundary portion BA1 may be provided in plural. The first boundary portions BA1 may correspond to an area between two light emitting elements OLED adjacent to each other among the light emitting elements OLED disposed on the first and second non-folding portions NFP1 and NFP2.

First openings OP1 may be defined in the first boundary portions BA1. The first openings OP1 may overlap the first boundary portions BA1. When viewed in the plane (i.e., in a plan view), the first openings OP1 may be defined between two light emitting elements OLED adjacent to each other among the light emitting elements OLED disposed in the first and second non-folding portions NFP1 and NFP2. The first to seventh transistors T1 to T7 described with reference to FIG. 6 may be disposed between the first openings OP1.

The first openings OP1 may be defined through at least one of the inorganic insulating layers INS1 to INS5 in an order from the uppermost layer (i.e., INS5) to the lowermost layer (i.e., INS1). As an example, the first openings OP1 may be defined through the fifth inorganic insulating layer INS5.

Organic insulating layers INS6 and INS7 may be disposed on the buffer layer BFL and the inorganic insulating layers INS1 to INS5. The organic insulating layers INS6 and INS7 may include a sixth insulating layer INS6 and a seventh insulating layer INS7. The sixth and seventh insulating layers INS6 and INS7 may include an organic layer.

The sixth insulating layer INS6 may be disposed on the fifth insulating layer INS5 to cover the first connection electrode CNE1. The sixth insulating layer INS6 may be disposed in the first openings OP1, and the first openings OP1 may be filled with a material of the sixth insulating layer INS6.

A second connection electrode CNE2 may be disposed on the sixth insulating layer INS6. The second connection electrode CNE2 may be connected to the first connection electrode CNE1 via a second contact hole CH2 defined through the sixth insulating layer INS6.

A conductive pattern CLS may be disposed on the sixth insulating layer INS6. The conductive pattern CLS may be the data lines DL1 to DLn or the first power line PL1 shown in FIG. 5.

The seventh insulating layer INS7 may be disposed on the sixth insulating layer INS6 to cover the second connection electrode CNE2 and the conductive pattern CLS.

The light emitting element OLED may be disposed on the seventh insulating layer INS7. The light emitting element OLED may include a first electrode AE, a second electrode CE, a hole control layer HCL, an electron control layer ECL, and a light emitting layer EML. The first electrode AE may be the anode AE shown in FIG. 6, and the second electrode CE may be the cathode CE shown in FIG. 6.

The first electrode AE may be disposed on the seventh insulating layer INS7. The first electrode AE may be electrically connected to the second connection electrode CNE2 via a third contact hole CH3 defined through the seventh insulating layer INS7. A pixel definition layer PDL that exposes a predetermined portion of the first electrode AE may be disposed on the first electrode AE and the seventh insulating layer INS7. An opening PX_OP may be defined through the pixel definition layer PDL to expose the predetermined portion of the first electrode AE.

The hole control layer HCL may be disposed on the first electrode AE and the pixel definition layer PDL. The hole control layer HCL may be commonly disposed in a light emitting area LEA and a non-light-emitting area NLEA. The hole control layer HCL may include a hole transport layer and a hole injection layer.

The light emitting layer EML may be disposed on the hole control layer HCL. The light emitting layer EML may be disposed in an area corresponding to the opening PX_OP. The light emitting layer EML may include an organic material and/or an inorganic material. The light emitting layer EML may emit one of a red light, a green light, and a blue light.

The electron control layer ECL may be disposed on the light emitting layer EML and the hole control layer HCL. The electron control layer ECL may be commonly disposed in the light emitting area LEA and the non-light-emitting area NLEA. The electron control layer ECL may include an electron transport layer and an electron injection layer. The second electrode CE may be disposed on the electron control layer ECL. The second electrode CE may be commonly disposed over the pixels PX.

The thin film encapsulation layer TFE may be disposed on the light emitting element OLED. The thin film encapsulation layer TFE may include an inorganic layer, an organic layer, and an inorganic layer, which are sequentially stacked. The inorganic layers may include an inorganic material and may protect the pixels PX from moisture and oxygen. The organic layer may include an organic material and may protect the pixels PX from a foreign substance such as dust particles.

The first voltage ELVDD of FIG. 6 may be applied to the first electrode AE, and the second voltage ELVSS may be applied to the second electrode CE. Holes and electrons injected into the light emitting layer EML may be recombined to generate excitons, and the light emitting element OLED may emit the light by the excitons that return to a ground state from an excited state. The light emitting element OLED may emit the light, and thus, the image may be displayed.

Figure 10:
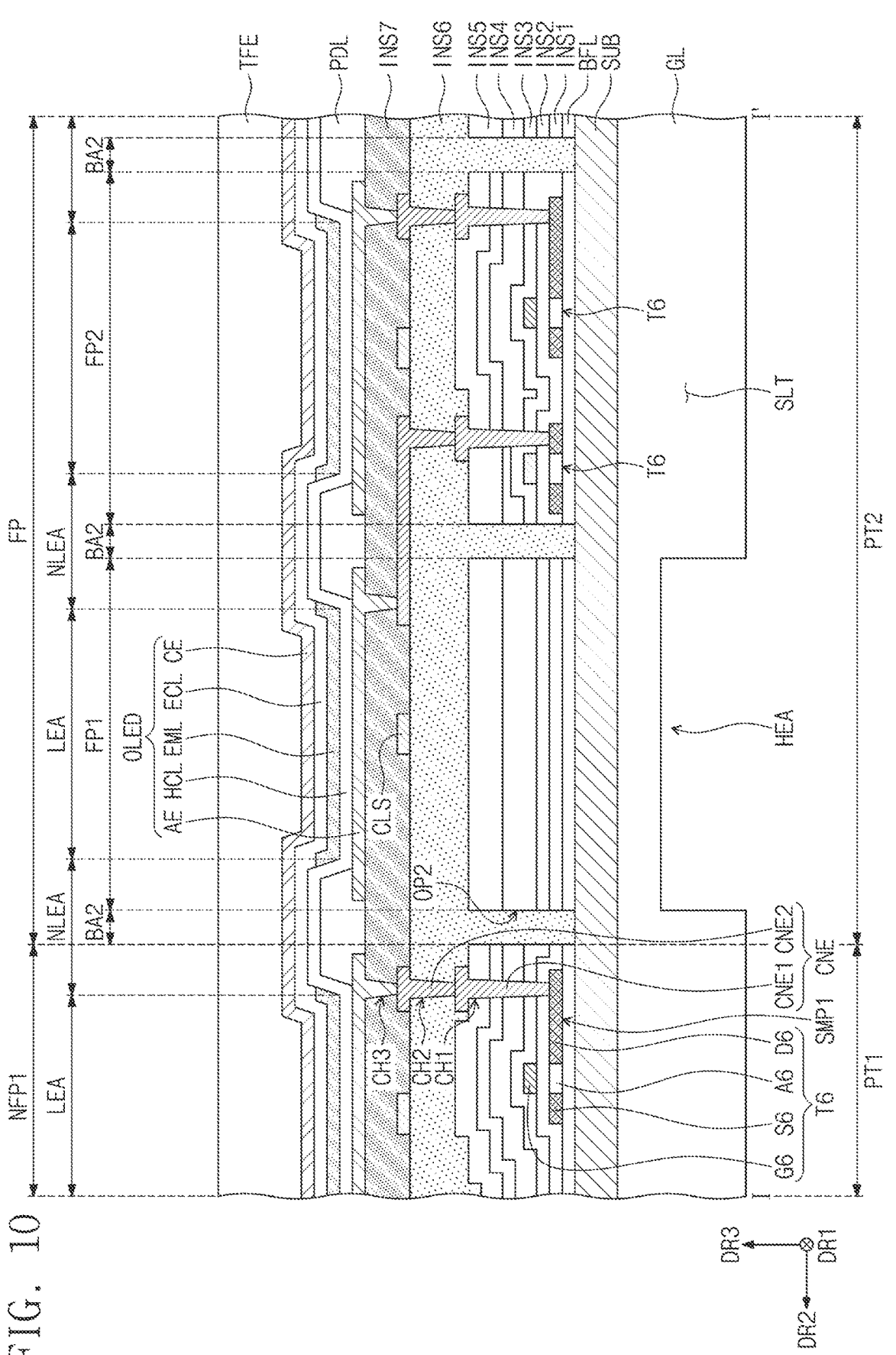
FIG. 10 is a cross-sectional view of a light emitting element and transistors disposed on a folding portion of a substrate shown in FIG. 8.

FIG. 10 is a cross-sectional view of the light emitting element and the transistors disposed on the folding portion of the substrate shown in FIG. 8.

FIG. 10 is a cross-sectional view taken along a line I-I' of FIG. 8. In addition, FIG. 10 shows the sixth transistors T6 disposed in the first non-folding portion NFP1, which is adjacent to the folding portion FP, and the second folding portion FP2 and the light emitting elements OLED disposed in the folding portion FP.

Since the first non-folding portion NFP1 shown in FIG. 10 has substantially the same structure as the structure of the first non-folding portion NFP1 shown in FIG. 9, the first non-folding portion NFP1 will be omitted or briefly described, and the folding portion FP will be mainly described.

Referring to FIG. 10, the folding portion FP may include the first folding portion FP1 and the second folding portion FP2. Each of the first folding portion FP1 and the second folding portion FP2 may be substantially provided in plural. Hereinafter, for the convenience of explanation, one first folding portion FP1 and one second folding portion FP2 will be described in detail.

The first folding portion FP1 may overlap the recess portion HEA. The second folding portion FP1 may overlap the rib portion SLT.

The first folding portion FP1 may include the buffer layer BFL, the first to fifth insulating layers INS1 to INS5, the organic insulating layers INS6 and INS7, and the light emitting element OLED. The buffer layer BFL may be disposed on the substrate SUB. The first to fifth insulating layers INS1 to INS5 may be sequentially stacked on the buffer layer BFL.

The second folding portion FP2 may include the buffer layer BFL, the first to seventh insulating layers INS1 to IN7, the light emitting element OLED, and the sixth transistors T6. The buffer layer BFL may be disposed in the second folding portion FP2. The transistors TR may be disposed on the buffer layer BFL. Since the first insulating layer INS1 to the fifth insulating layer INS5 of the second folding portion FP2 have substantially the same stack structure as the stack structure of the first insulating layer INS1 to the fifth insulating layer INS5 of the first non-folding portion NFP1 shown in FIG. 9, details thereof will be omitted.

For the convenience of explanation, only the sixth transistors T6 are illustrated in FIG. 10. However, although not shown in figures, the first to seventh transistors T1 to T7 and at least one capacitor CAP shown in FIG. 6 connected to each other may be disposed on the rib portion SLT.

The substrate SUB may include second boundary portions BA2. The second boundary portions BA2 may be disposed between the first non-folding portion NFP1 and the folding portion FP. As an example, the second boundary portions BA2 may be disposed between the first non-folding portion NFP1 and the first folding portion FP1. The second boundary portions BA2 may be disposed between the first folding portion FP1 and the second folding portion FP2. When viewed in the plane (i.e., in a plan view), the second boundary portions BA2 may be disposed between the light emitting element OLED disposed in the first non-folding portion NFP1 and the light emitting element OLED disposed in the first folding portion FP1. When viewed in the plane, the second boundary portions BA2 may be disposed between the light emitting element OLED disposed in the first folding portion FP1 and the light emitting element OLED disposed in the second folding portion FP2. Although not shown in figures, the second boundary portions BA2 may be disposed between the second non-folding portion NFP2 and the folding portion FP.

Second openings OP2 may be defined through the inorganic insulating layers INS1 to INS5. The second openings OP2 may be defined through at least two inorganic insulating layers INS1 to INS5. The second openings OP2 may be defined in the second boundary portions BA2. The second openings OP2 may overlap the second boundary portions BA2. The second openings OP2 may be defined between the first non-folding portion NFP1 and the folding portion FP. The second openings OP2 may overlap a boundary between the rib portion SLT and the recess portion HEA. That is, the second openings OP2 may be defined between the first and second folding portions FP1 and FP2. Although not shown in figures, the second openings OP2 may be defined between the folding portion FP and the second non-folding portion NFP2 shown in FIG. 8. The first to seventh transistors T1 to T7 may be arranged between the second openings OP and may overlap the rib portion SLT.

The second openings OP2 may be defined deeper than the first openings OP1 shown in FIG. 9. As an example, the second openings OP2 may be defined through the buffer layer BFL and the inorganic insulating layers INS1 to INS5 in FIG. 10. Accordingly, the second openings OP2 may be defined deeper than the first openings OP1 defined through the fifth insulating layer INS5 in the third direction DR3.

The second openings OP2 may be filled with the materials of the organic insulating layers INS6 and INS7. As an example, the second openings OP2 may be filled with the material of the sixth insulating layer INS6.

The second connection electrodes CNE2 may be disposed on the sixth insulating layer INS6. The second connection electrodes CNE2 may extend in the second direction DR2 and may overlap the first folding portion FP1, the second boundary portion BA2, and the second folding portion FP2. The second connection electrode CNE2 may be connected to the first connection electrode CNE1 disposed in the second folding portion FP2 via the second contact hole CH2 defined through the sixth insulating layer INS6.

The conductive patterns CLS may be disposed on the sixth insulating layer INS6. The conductive patterns CLS may be the data lines DL1 to DLn or the first power line PL1 shown in FIG. 5.

The seventh insulating layer INS7 may be disposed on the sixth insulating layer INS6 to cover the second connection electrodes CNE2 and the conductive patterns CLS.

The light emitting elements OLED may be disposed on the seventh insulating layer INS7. The light emitting elements OLED may be disposed in the first and second folding portions FP1 and FP2. The first electrodes AE of the light emitting elements OLED may be electrically connected to the second connection electrodes CNE2 via the third contact hole CH3 defined through the seventh insulating layer INS7.

For the convenience of explanation, the sixth transistor T6 connected to the light emitting element OLED in the folding portion FP is shown, however, the first to seventh transistors T1 to T7 shown in FIG. 6 may be connected to one light emitting element OLED.

According to a conventional display device, the first to seventh transistors T1 to T7 may be disposed in the first folding portion FP1 of the folding portion FP. In this case, when external impacts are applied to the first folding portion FP1 due to an external object, such as a pen, dropped down on the display panel DP, cracks may occur in the inorganic insulating layers INS1 to INS5 in one folding portion, which are relatively rigid. In particular, the cracks may be easily formed in the first folding portion FP1 overlapping the recess portion HEA. The cracks may be propagated to a periphery thereof and then may be propagated to the transistors TR. In this case, the transistors TR in the next folding portion may be damaged by the cracks.

However, according to an embodiment, the support layer GL may be attached to the lower surface of the substrate SUB, the recess portions HEA may be defined in the second portion PT2 of the support layer GL, and the second portion PT2 may include the rib portions SLT between the recess portions HEA. Accordingly, the flexibility of the second portion PT2 may be improved, and thus, the support layer GL may be easily folded.

In addition, the first to seventh transistors T1 to T7 may not be disposed in the first folding portions FP1 of the substrate SUB overlapping the recess portions HEA, and the first to seventh transistors T1 to T7 may be disposed in the second folding portions FP2 of the substrate SUB overlapping the rib portions SLT. Accordingly, the first to seventh transistors T1 to T7 may be stably disposed in the folding portion FP.

The first openings OP1 may be defined through the inorganic insulating layers INS1 to INS5 in the first and second non-folding portions NFP1 and NFP2, the second openings OP2 may be defined through the inorganic insulating layers INS1 to INS5 in the folding portion FP, and the second openings OP2 may be defined deeper than the first openings OP1. As the second openings OP2 are defined between the first and second folding portions FP1 and FP2, the first to seventh transistors T1 to T7 may be disposed between the second openings OP2. Accordingly, even though the crack occurs in one folding portion in the inorganic layers due to the external impacts, the cracks may not be propagated to the first to seventh transistors T1 to T7 in the next folding portion the folding portion FP, and thus, the first to seventh transistors T1 to T7 in the next folding portion may be prevented from being damaged.

Figure 11:
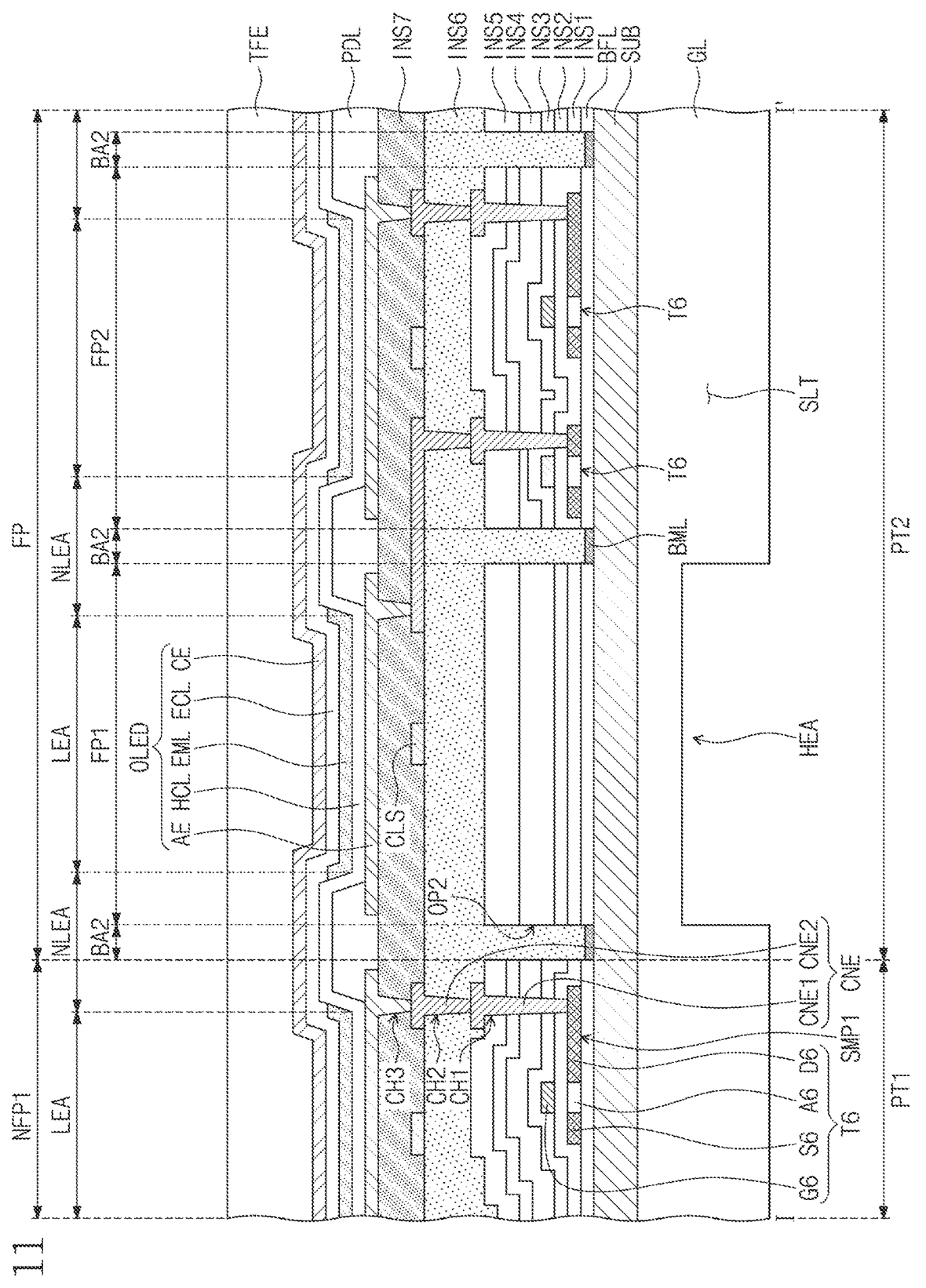
FIG. 11 is a cross-sectional view of a display panel and a support layer according to an embodiment of the present disclosure.

FIG. 11 is a cross-sectional view of a display panel and a support layer according to an embodiment of the present disclosure.

the first to seventh Transistors T1 to T7, the support layer GL, a substrate SUB, inorganic insulating layers INS1 to INS5, organic insulating layers INS6 and INS7, and light emitting elements OLED shown in FIG. 11 may be substantially the same as the first to seventh transistors T1 to T7, the support layer GL, the substrate SUB, the inorganic insulating layers INS1 to INS5, the organic insulating layers INS6 and INS7, and the light emitting elements OLED shown in FIGS. 9 and 10, and thus, details thereof will be omitted or briefly described.

As described above, each of pixels may include first to seventh transistors T1 to T7. For the convenience of explanation, a sixth transistor T6 connected to the light emitting element OLED in a folding portion FP is illustrated in FIG. 11, however, the first to seventh transistors T1 to T7 shown in FIG. 6 may be connected to one light emitting element OLED.

Referring to FIG. 11, light blocking layers BML may be further disposed on the substrate SUB. The light blocking layers BML may be disposed on second boundary portions BA2. A buffer layer BFL may be disposed on the light blocking layers BML. Second openings OP2 may be defined through the inorganic insulating layers INS1 to INS5 and the buffer layer BFL. The light blocking layers BML may be disposed in the second openings OP2.

The light blocking layers BML may be a floating electrode that is electrically isolated without being electrically connected to another electrode or another signal line. However, the present disclosure should not be limited thereto or thereby, and according to an embodiment, the light blocking layer BML may be connected to the first power line PL1 of FIG. 5.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present invention shall be determined according to the attached claims.

What is claimed is:

1. A display device comprising:
   a substrate comprising a first non-folding portion, a second non-folding portion and a folding portion therebetween;
   a support layer disposed under the substrate and comprising a plurality of first portions overlapping the first and second non-folding portions, respectively, and a second portion overlapping the folding portion in a plan view;
   a plurality of transistors disposed on the substrate; and a plurality of light emitting elements disposed above the transistors and connected to the transistors, wherein the second portion comprises a plurality of rib portions disposed between recess portions defined in a lower surface of the second portion, wherein the folding portion comprises:

a plurality of first folding portions overlapping the recess portions; and a plurality of second folding portions overlapping the rib portions in the plan view, wherein the transistors are not disposed in the first folding portions.

2. The display device of claim 1, wherein the rib portions extend in a first direction and are arranged spaced apart from each other in a second direction crossing the first direction, and the second non-folding portion, the folding portion, and the first non-folding portion are arranged in the second direction.

3. The display device of claim 1, further comprising:

a buffer layer disposed on the substrate;

a plurality of inorganic insulating layers disposed on the buffer layer; and at least one organic insulating layer disposed on the inorganic insulating layers, wherein the transistors are disposed on the buffer layer, some of the inorganic insulating layers are disposed on the transistors, and the light emitting elements are disposed on the at least one organic insulating layer.

4. The display device of claim 3, wherein at least one inorganic insulating layer among the inorganic insulating layers in an order from an uppermost layer to a lowermost layer of the inorganic insulating layers is provided with first openings defined therethrough in the first and second non-folding portions, and the first openings are defined between the light emitting elements disposed in the first and second non-folding portions in the plan view.

5. The display device of claim 4, wherein a material of the at least one the organic insulating layer is filled in the first openings.

6. The display device of claim 4, wherein at least two inorganic insulating layers among the inorganic insulating layers are provided with second openings defined therethrough in the folding portion, and the second openings are defined deeper than the first openings.

7. The display device of claim 6, wherein the material of the at least one the organic insulating layer is filled in the second openings.

8. The display device of claim 6, further comprising a plurality of light blocking layers disposed on the substrate, wherein the second openings are defined through the buffer layer.

9. The display device of claim 6, wherein the second openings are defined to overlap a boundary between the rib portions and the recess portions.

10. The display device of claim 6, wherein the transistors are disposed between the second openings in the folding portion.

11. The display device of claim 6, wherein the second openings are further defined between the folding portion and the first non-folding portion and between the folding portion and the second non-folding portion.

12. The display device of claim 1, wherein the light emitting elements are disposed in the first and second folding portions.

13. The display device of claim 12, wherein the transistors are disposed in the second folding portion and connected to the light emitting elements disposed in the first and second folding portions.

14. The display device of claim 1, wherein the transistors comprise a silicon transistor or an oxide transistor, and the oxide transistor is placed at a position higher than the silicon transistor.

15. The display device of claim 14, further comprising a plurality of inorganic insulating layers disposed on the substrate, wherein some of the inorganic insulating layers cover the oxide transistor and the silicon transistor.

16. The display device of claim 1, wherein the support layer comprises a glass material.

17. The display device of claim 1, wherein the recess portions extend from a same height as a lower surface of the rib portions to a point corresponding to a half of a thickness of the rib portions.

18. A display device comprising:

a substrate comprising a first non-folding portion, a second non-folding portion, and a folding portion therebetween;

a support layer disposed under the substrate and comprising a plurality of rib portions overlapping the folding portion and defining recess portions between the rib portions;

a plurality of transistors disposed on the substrate; and a plurality of light emitting elements disposed above the transistors and connected to the transistors, wherein the folding portion comprises:

a plurality of first folding portions overlapping the recess portions in a plan view; and a plurality of second folding portions overlapping the rib portions, wherein the transistors are disposed in the second folding portions and not disposed in the first folding portions.

19. The display device of claim 18, further comprising:

a buffer layer disposed on the substrate;

a plurality of inorganic insulating layers disposed on the buffer layer; and at least one organic insulating layer disposed on the inorganic insulating layers, wherein at least one inorganic insulating layer among the inorganic insulating layers is provided with first openings defined therethrough in the first and second non-folding portions, at least two inorganic insulating layers among the inorganic insulating layers are provided with second openings defined therethrough in the folding portion, and the second openings are defined deeper than the first openings.

20. The display device of claim 18, wherein the light emitting elements are disposed in the first and second folding portions, and the transistors disposed in the second folding portions are connected to the light emitting elements disposed in the first and second folding portions.

* * * * *